(12) United States Patent
McBride (10) Patent No.: US 7,194,667 B2
(45) Date of Patent: *Mar. 20, 2007

(54) SYSTEM FOR STORING DEVICE TEST INFORMATION ON A SEMICONDUCTOR DEVICE USING ON-DEVICE LOGIC FOR DETERMINATION OF TEST RESULTS

(75) Inventor: Jerry D. McBride, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/794,696

(22) Filed: Mar. 5, 2004

(65) Prior Publication Data

US 2004/0181724 A1 Sep. 16, 2004

Related U.S. Application Data

(63) Continuation of application No. 09/651,858, filed on Aug. 30, 2000, now Pat. No. 6,829,737.

(51) Int. Cl.
*G11C 29/00* (2006.01)
*G01R 31/00* (2006.01)

(52) U.S. Cl. .................................. 714/718; 365/201

(58) Field of Classification Search ........ 714/718–720, 714/724–725; 324/763–765; 365/200–201
See application file for complete search history.

(56) References Cited

U.S. PATENT DOCUMENTS

| | | | |
|---|---|---|---|
| 4,032,949 A | 6/1977 | Bierig | ........................ 257/529 |
| 4,455,495 A | 6/1984 | Masuhara et al. | |
| 4,534,014 A | 8/1985 | Ames | |
| 4,592,025 A | 5/1986 | Takemae et al. | ............. 365/200 |
| 4,707,806 A | 11/1987 | Takemae et al. | .............. 365/96 |
| 5,110,754 A | 5/1992 | Lowrey et al. | ............. 438/386 |
| 5,235,550 A | 8/1993 | Zagar | .......................... 365/226 |
| 5,254,943 A * | 10/1993 | Momose | ..................... 714/724 |
| 5,296,402 A | 3/1994 | Ryou | .......................... 438/152 |
| 5,301,143 A | 4/1994 | Ohri et al. | .................... 365/96 |
| 5,313,424 A | 5/1994 | Adams et al. | |
| 5,345,110 A | 9/1994 | Renfro | ....................... 327/119 |
| 5,352,945 A | 10/1994 | Casper et al. | ............... 327/262 |

(Continued)

OTHER PUBLICATIONS

Micron Technology, Inc., Quality/Reliability Handbook, 1995, entire book.

*Primary Examiner*—Shelly Chase
(74) *Attorney, Agent, or Firm*—TraskBritt (57) ABSTRACT

A system for testing a semiconductor device and storing device test results in nonvolatile memory elements on the tested device, in which the semiconductor device includes logic circuitry which allows test results to be determined on the device. Test results are stored temporarily in one or more latch elements on the semiconductor device and are subsequently stored in nonvolatile memory elements. The invention eliminates the need for device testing equipment to perform a determination of test results and thus may simplify the design of test equipment. In one embodiment of the invention, passing test results are stored in a mixed code of set and unset nonvolatile memory elements such that the test results contain information about correct application of test signals as well as correct functioning of the semiconductor device.

15 Claims, 7 Drawing Sheets

U.S. PATENT DOCUMENTS

| | | | |
|---|---|---|---|
| 5,424,652 A | 6/1995 | Hembree et al. | 324/765 |
| 5,428,311 A | 6/1995 | McClure | |
| 5,440,240 A | 8/1995 | Wood et al. | 324/765 |
| 5,457,400 A * | 10/1995 | Ahmad et al. | 324/763 |
| 5,539,235 A | 7/1996 | Allee | 257/390 |
| 5,539,699 A * | 7/1996 | Sato et al. | 365/201 |
| 5,563,832 A | 10/1996 | Kagami | 365/200 |
| 5,590,069 A | 12/1996 | Levin | |
| 5,600,171 A | 2/1997 | Makihara et al. | 257/390 |
| 5,606,193 A | 2/1997 | Ueda et al. | 257/390 |
| 5,617,366 A | 4/1997 | Yoo | 365/201 |
| 5,619,469 A | 4/1997 | Joo | 365/225.7 |
| 5,677,917 A | 10/1997 | Wheelus et al. | 714/726 |
| 5,768,288 A | 6/1998 | Jones | 714/725 |
| 5,867,505 A | 2/1999 | Beffa | 714/718 |
| 5,895,962 A | 4/1999 | Zheng et al. | |
| 5,896,398 A * | 4/1999 | Sekine | 714/720 |
| 5,919,269 A | 7/1999 | Ong | |
| 5,944,845 A | 8/1999 | Miller, Jr. | |
| 5,982,189 A | 11/1999 | Motika et al. | |
| 5,991,220 A | 11/1999 | Freyman et al. | 365/225.7 |
| 6,002,620 A | 12/1999 | Tran et al. | 365/200 |
| 6,008,523 A | 12/1999 | Narayan et al. | 257/529 |
| 6,016,265 A | 1/2000 | Yoshida et al. | 365/96 |
| 6,021,078 A | 2/2000 | Le et al. | 365/225.7 |
| 6,025,129 A | 2/2000 | Nova et al. | 435/6 |
| 6,118,138 A | 9/2000 | Farnworth | 257/48 |
| 6,127,837 A | 10/2000 | Yamamoto et al. | |
| 6,190,972 B1 | 2/2001 | Zheng et al. | 439/275 |
| 6,194,738 B1 | 2/2001 | Debenham et al. | |
| 6,904,552 B2 | 3/2001 | Cowles | 714/719 |
| 6,212,114 B1 | 4/2001 | Cowles | 365/201 |
| 6,233,182 B1 | 5/2001 | Satou et al. | 365/200 |
| 6,255,837 B1 | 7/2001 | Habersetzer et al. | |
| 6,269,035 B1 | 7/2001 | Cowles et al. | 365/200 |
| 6,292,009 B1 | 9/2001 | Farnworth et al. | 324/765 |
| 6,324,657 B1 | 11/2001 | Fister et al. | 714/42 |
| 6,343,366 B1 | 1/2002 | Okitaka | 714/733 |
| 6,353,563 B1 | 3/2002 | Hii et al. | 365/201 |
| 6,365,421 B2 | 4/2002 | Debenham et al. | |
| 6,611,458 B2 | 8/2003 | Ishibashi et al. | |
| 6,630,685 B1 | 10/2003 | Lunde | |
| 6,839,873 B1 | 1/2005 | Moore | |
| 6,894,526 B2 | 5/2005 | Marr | |
| 2002/0133769 A1 | 9/2002 | Cowles et al. | 714/719 |
| 2002/0133770 A1 | 9/2002 | Cowles et al. | 714/711 |

* cited by examiner

SYSTEM FOR STORING DEVICE TEST INFORMATION ON A SEMICONDUCTOR DEVICE USING ON-DEVICE LOGIC FOR DETERMINATION OF TEST RESULTS

CROSS-REFERENCE TO RELATED APPLICATION

This application is a continuation of application Ser. No. 09/651,858, filed Aug. 30, 2000, now U.S. Pat. No. 6,829,737, issued Dec. 7, 2004.

BACKGROUND OF THE INVENTION

1. Field of the Invention

The present invention relates to integrated circuit test circuits and methods. In particular, the present invention relates to storage of test result data on an integrated circuit device in nonvolatile memory elements and, most particularly, to the inclusion of logic in the integrated circuit device for determining the results of device tests and enabling the storage of test results in the nonvolatile memory elements.

2. Statement of the Art

Semiconductor integrated circuit devices are manufactured on wafers or other substrates of semiconductor material. Conventionally, many devices are manufactured on a single wafer and individual devices or groups of devices are cut from the wafer and packaged. The devices are tested at various points during the manufacturing process, e.g., with electrical probes while they are still on the wafer, in die form (after singulation but prior to packaging) and after packaging.

During testing, a particular signal or combination of signals is input to the device and the output value or values read from the device are compared with values expected to be obtained from a properly functioning device. Tests may involve a particular signal or combination of signals being delivered repetitively, perhaps under extreme environmental conditions (temperature, voltage, etc.) in order to identify a device which would fail after a shorter than usual period of use ("burn-in" testing). Other tests may involve a number of different signals or signal combinations delivered in sequence. One method for testing a memory device is to deliver the same signal/signal combination to multiple identical subsections of the device simultaneously and compare the values read from the subsections ("compression testing"). If all of the respective, read values match, the test has been passed, while a mismatch between respective values read from any of the subsections indicates a device malfunction and failure of the test.

A particular test or test sequence often includes multiple test steps. Moreover, a complete test flow will often require that devices move from one piece of test equipment to another. For example, a first piece of test equipment and test fixtures may be utilized for probe: testing, another for burn-in testing and yet another for packaged device testing after burn-in.

After a particular test or test sequence has been completed, devices which have failed some or all of a test may be separated from the good devices. However, a device which has failed one portion of the test sequence may pass subsequent test sequences, so if it is erroneously placed into the "good" bin and then passes subsequent tests it may eventually be classified and sold as fully functional. One way to avoid this type of error is to store information regarding the test history of the device on the device itself in nonvolatile memory elements. One example describing storage of test results in nonvolatile memory on a semiconductor device is co-pending U.S. patent application Ser. No. 08/946,027, the disclosure of which is hereby incorporated herein by reference.

Test equipment used for testing integrated circuit devices conventionally transmits a test signal and then receives an output signal from the integrated circuit device. The test equipment then compares the output signal from the integrated circuit device with the value expected to be obtained from a properly functioning device and sends an instruction to the device which causes a specific nonvolatile memory element to be set to indicate either pass or fail of the test step. A series of nonvolatile memory elements may be set to indicate the results of a series of tests or test steps. The tester thus must include detectors and comparators so that it can read the output signal and perform a comparison to determine passage or failure of the test.

It would be advantageous to decrease the cost and complexity of the tester by eliminating the need for detectors and comparators on the test equipment.

It would be advantageous to eliminate the need for intelligence in device test equipment, by instead placing intelligence on the device being tested.

It would be desirable to provide for the storage of information concerning correct application of test sequences to the device on the device itself.

These and other advantages are provided by the invention.

BRIEF SUMMARY OF THE INVENTION

The present invention includes a method and system for storing semiconductor device test results on a tested device, using on-device test circuitry for the determination of test results and control of test result storage. The semiconductor device, which may be a memory device, a microprocessor, or other semiconductor device, includes a plurality of nonvolatile memory elements which are set to indicate the results of a series of multiple tests or test steps. The semiconductor device may also include comparator circuitry, which compares test signals sent to the semiconductor device from a tester with data values read from the semiconductor device following receipt of the test signals, or which performs a comparison between data values read from multiple regions of a device, to determine correct functioning of the device. The semiconductor device includes a latch which is set to indicate passage or failure of the test. The latch enables circuitry which causes a nonvolatile memory element to be set upon receipt of an instruction from the tester. The latch, and subsequently the nonvolatile memory element,is set to represent the test results according to a predetermined rule. Typically, one logic level is latched to represent passage of a test and another is used to represent failure of the test. For example, logic high could represent pass and logic low would then represent fail or, alternatively, logic low could represent pass and logic high represent fail. Similarly, the nonvolatile memory element is set to one state to represent passage of a test and another to represent failure of the test.

By locating the circuitry that controls setting of memory elements to represent test results on the device being tested, the tester equipment does not need to receive values from the device being tested, perform a comparison between test values and received values to determine the outcome of the test, or determine whether a memory element should be set to store the test result. The tester needs only to transmit test signals and set signals to the semiconductor device, without receiving any values back from the semiconductor device. Accordingly, the design and construction of the test equipment can be simplified considerably.

In one embodiment of the invention, a rule used to determine the settings of latches and nonvolatile memory elements to represent pass/fail status is dependent on the test or test step being performed. That is, for certain tests/test steps a first state would represent pass and a second state would represent fail, while for other tests/test steps the second state would represent pass and the first state would represent fail. Therefore, a device which had passed all tests would be expected to have nonvolatile memory elements set in a predetermined pattern of first and second states. The pattern of first and second states corresponding to a known good device is obtained only when the device has been properly connected to the test equipment, received appropriate test signals and passed all tests.

DETAILED DESCRIPTION OF THE INVENTION

Figure 1:
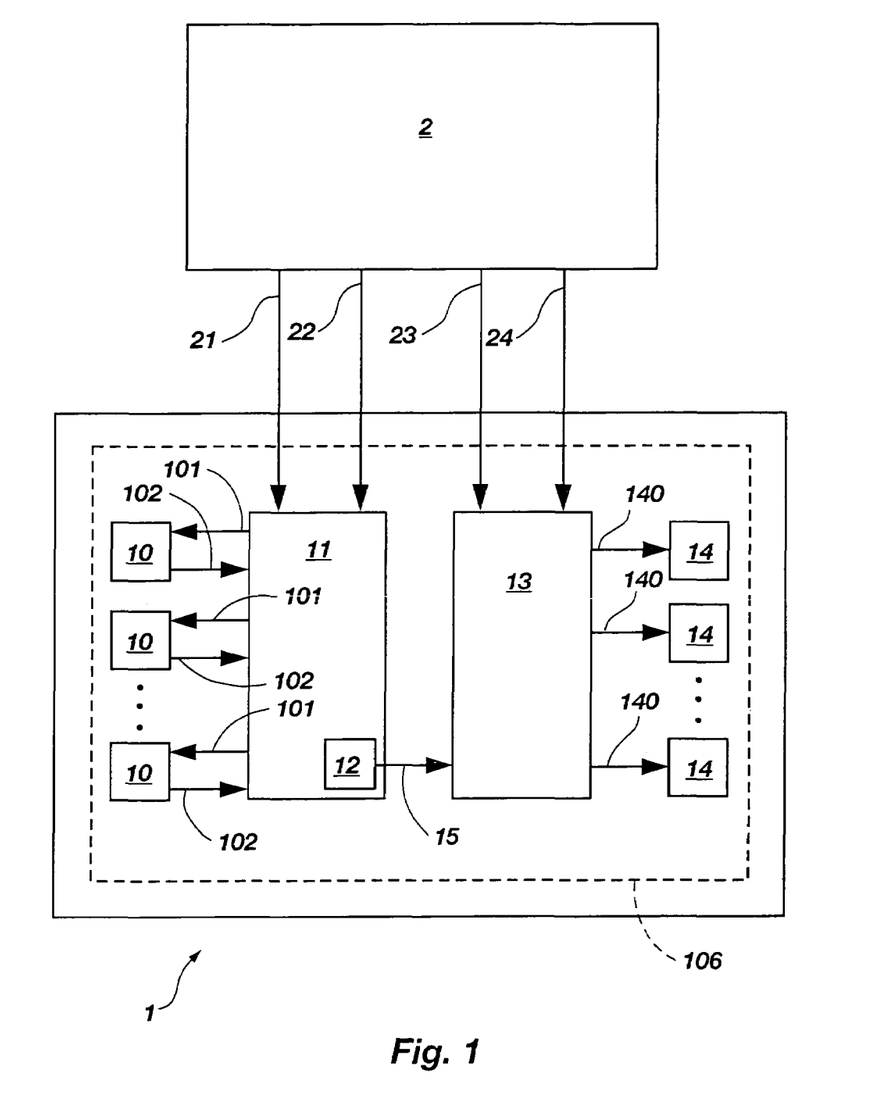
FIG. 1 is a block diagram of an integrated circuit tester and an integrated circuit according to an embodiment of the invention.

A schematic diagram of an embodiment of the present invention is shown in FIG. 1. An integrated circuit device is indicated at 1, and the integrated circuit device tester used for testing the integrated circuit device is indicated at 2.

Integrated Circuit Device Tester

Integrated circuit device tester 2 may be used for testing integrated circuit device 1. Integrated circuit device tester 2 is configured for sending a test signal on test signal line 21 and a test address signal on test address line 22. The test address signal specifies the address on integrated circuit device 1 to which the test signal is to be sent. Integrated circuit device tester 2 is also configured for sending a set signal on set signal line 23 and a set address signal on set address line 24. Lines 21, 22, 23 and 24 may be single lines or may be buses that carry multiple signals or bits of data. The set address signal indicates the address of the nonvolatile memory element which is to be set to indicate whether the device has passed or failed a particular test or test step. Integrated circuit device tester 2 has the capability of being programmed to perform multiple test steps, at each test step delivering a particular test signal to a particular address or set of addresses and subsequently sending a set signal and set address signal to select the nonvolatile memory device address memory which is to store the results of the test step. The set signal does not cause the nonvolatile memory element to be set directly, but enables setting of the nonvolatile memory element by circuitry on integrated circuit device 1.

Integrated circuit device tester 2 performs similarly to testers currently used in integrated circuit device testing. However, integrated circuit device tester 2 does not need to perform many of the functions conventionally performed by prior testers. For example, without limitation, integrated circuit device tester 2 does not need to perform the functions of reading values from integrated circuit device 1, comparing these values with expected values and, based on the results of the comparison, generating an instruction for setting a fuse or other nonvolatile memory element on integrated circuit device 1. Thus, integrated circuit device tester 2 used in the practice of the invention could be a conventional tester programmed to omit unnecessary functions, but still including the detectors, comparators and other hardware which may be used in reading and comparison steps, or it could be a redesigned tester which did not include the detectors, comparators and other hardware rendered superfluous by the present invention.

Integrated Circuit Device

Integrated circuit device 1 may be a memory device such as a Dynamic Random Access Memory (DRAM), Static Random Access Memory (SRAM), or Video Random Access Memory (VRAM), FLASH or other nonvolatile memory devices, a microprocessor, microcontroller, memory controller, Application Specific Integrated Circuit (ASIC) or other device which is to undergo a test sequence. Integrated circuit device 1 may include various elements depending upon the type of the device. However, only those elements relevant to the functioning of the test circuitry of the present invention are shown in the Figures. Referring now to FIG. 1, integrated circuit device 1 includes test circuitry 106 (surrounded by a dashed line) which includes send/receive locations 10, comparator circuit 11, at least one test latch 12, set logic 13, and nonvolatile memory elements 14. The comparator circuit 11, test latch 12, and set logic 13 may be included in integrated circuit device 1 in order to carry out the invention and may not be involved in its regular operation. However, it is contemplated that circuit elements used in the regular operation of the integrated circuit device may also be used in the practice of the invention. Test latch 12 is a latch element capable of latching at least two voltage levels ("logic high" or "logic low"). Various types of latches and latch circuits are well known to those of ordinary skill in the art. One example of a latch suitable for use in the present invention is an S-R NOR latch. Nonvolatile memory elements 14 used in the practice of the invention may be existing nonvolatile memory elements already present on integrated circuit device 1 or may be included in integrated circuit device 1 specifically for use in the invention.

Send/receive locations 10 may be memory locations if integrated circuit device 1 is a memory device, or they may be inputs and outputs to an integrated circuit if integrated circuit device 1 is something other than a memory device, for example, a microprocessor, microcontroller, memory controller, ASIC, etc. Send/receive locations 10 are employed in the normal functioning of integrated circuit 1, whereas other components of test circuitry 106 are included for testing purposes and may not be used in routine operation of the integrated circuit. Integrated circuit device 1 may include multiple send/receive locations 10. At a given test step, the send/receive location to be tested is selected according to the test address signal sent on test address line 22 by the integrated circuit device tester 2. Alternatively, it would be possible to access a given send/receive location 10 by means of a direct line without the use of addressing. Each send/receive location 10 may contain one bit or multiple bits (for example, a byte or 8 bits). A test signal is sent to the selected send/receive location 10 on input line 101, and the resulting output signal is received by comparator circuit 11 on corresponding output line 102. Input line 101 and output line 102 may be either the same or separate lines. If send/receive location 10 contains multiple bits, input line 101 and output line 102 may be either parallel or serial lines. Comparator circuit 11 performs a comparison between the value received from the selected send/receive location 10 and the value expected to be obtained from a properly functioning device. For example, if the addressed send/receive location 10 is a memory location, the value read from the memory location should be the same as the value written to the memory location. If a device other than a memory device is being tested, it may be the case that the output value from a particular address will not be the same as that input to the location. However, if the device is functioning properly, a particular output will always correspond to a particular input. The comparator circuit 11 may store (e.g., latch) the current test value for use as the expected value if a memory device is being tested or it may receive an expected value sent from integrated circuit device tester 2 separate from the test signal. As a further alternative, the expected value may be preset in the device according to a predetermined design rule. In this case, comparator circuit 11 may not truly perform a comparison between the output and the expected value. Since the expected value is always the same, comparator circuit 11 need only be configured so that one output value causes the latch to be set and the other causes it to be unset. This approach would have application primarily in the testing of memory devices.

Test latch 12 may be set depending on whether or not the output from the send/receive location matches the expected value. The latch setting preferably represents the pass or fail status of the test. Test latch 12 is connected to set logic 13 via latch signal line 15. When test latch 12 is set to a logical high value, set logic 13 receives an enable signal on latch signal line 15. At the end of a test step, integrated circuit device tester 2 sends a set signal on set signal line 23 and a set address signal on set address line 24. If both an enable signal and a set signal are received by set logic 13, the nonvolatile memory element 14 addressed by the set address signal is set by a signal on line 140, thereby providing a permanent record on the integrated circuit device 1 of the outcome of the test step. The nonvolatile memory elements 14 remain unset (i.e., set at its original value) if no enable signal is received at the time a set signal is received by set logic 13. It would also be possible to configure test latch 12 so that an enable signal is sent on latch signal line 15 when test latch 12 is set to a logic low value.

Nonvolatile memory elements 14 may include, without limitation, laser or electrical fuses, antifuses, FLASH memory cells, FERAM memory cells, or other nonvolatile memory elements, which may be set to at least two states (e.g., blown or unblown in the case of fuses or antifuses, programmed or unprogrammed in the case of FLASH memory cells, or logic high and logic low for other types of memory elements), one of which may represent a passing test result and one of which may represent a fail test result. Existing semiconductor devices conventionally include enough nonvolatile memory elements for storing data regarding device test results according to the method of the invention without adding additional elements. However, it is preferred that additional, dedicated nonvolatile memory elements be added. Integrated circuit device 1 may include multiple nonvolatile memory elements. Nonvolatile memory elements are preferably addressable, being accessed with the use of an address signal sent from integrated circuit device tester 2. However, in the alternative, nonvolatile memory elements could be accessed by dedicated lines or by other means, rather than being addressable.

By first setting test latch 12, and subsequently setting nonvolatile memory element 14 based on the value of test latch 12, the steps of performing a comparison and obtaining a test result are separated from the step of storing the test result in the nonvolatile memory element 14. It may be advantageous to separate these steps because the same inputs or signal lines may be used in the different steps; thus, separating the steps allows few inputs or lines to be used.

As discussed above, the setting of test latch 12, and subsequently the setting of a selected nonvolatile memory element 14, represent the result of a given test step. The relationship between the test result and the setting of nonvolatile memory element 14 will generally follow a predetermined rule. In the simplest case, the rule will be that for a particular test result, the latch will always be set to a particular value. For example, comparator circuit 11 may be configured to set test latch 12 to a logical high value if the value on output line 102 matches the expected value, i.e., the test step is passed, and a logical low value if the value on output line 102 does not match the expected value, i.e., the test step is failed. Alternatively, comparator circuit 11 may be configured so that test latch 12 is set to a logical high value if the output does not match the expected value, i.e., the test step has been failed, and to a logical low value if the test step is passed. The value to which nonvolatile memory element 14 is set then corresponds to the value to which test latch 12 is set, so that nonvolatile memory element 14 is blown, set or programmed, depending on the type of nonvolatile memory element when test latch 12 is set high and left unblown, unset or unprogrammed when test latch 12 is set low. Alternatively, nonvolatile memory element 14 could be blown, set or programmed when test latch 12 is set low, and vise versa.

In one embodiment of the invention, comparator circuit 11 and set logic 13 may be configured so that the setting of a nonvolatile memory element 14 is a function of both the result of the test step and the particular test step. At certain test steps a nonvolatile memory element 14 may be set to a first state if the test is passed and a second state if the test is failed, while at other test steps a nonvolatile memory element 14 may be set to a second state if the test is passed and a first state if the test is failed. For example, passing results for sequential test steps could be represented by a pattern of alternating first and second states. In this embodiment of the invention, a device which has passed all tests is expected to have nonvolatile memory elements set in a predetermined pattern of first and second states. The advantage of this approach is that the pattern of first and second states corresponding to a known good device is likely to be obtained only when the device has been properly connected to the test equipment, received appropriate test signals, and passed all tests. In contrast, if pass results are represented with a single nonvolatile memory setting, false pass results may be obtained if a device has all nonvolatile memory locations set to the same value prior to testing and the original settings are not changed during testing because the device is not properly connected to the semiconductor device.

Although it is preferred to include the step of setting a latch intermediate the steps of determining a test result and storing the test result in a nonvolatile memory element for the reasons noted previously, the concept of storing test results as a function of test step and test result could be applied in a system in which test results were stored directly in nonvolatile memory elements without the intermediate step of storing the results first in a latch. The general concept of storing test results in nonvolatile memory elements without intermediate storage in a latch is already known in the prior art.

As described above, the results of each test step may be represented in the setting of a selected nonvolatile memory element 14 according to a predetermined rule. Either one or both of comparator circuit 11 or set logic 13 may include circuitry which implements said predetermined rule.

Figure 2:
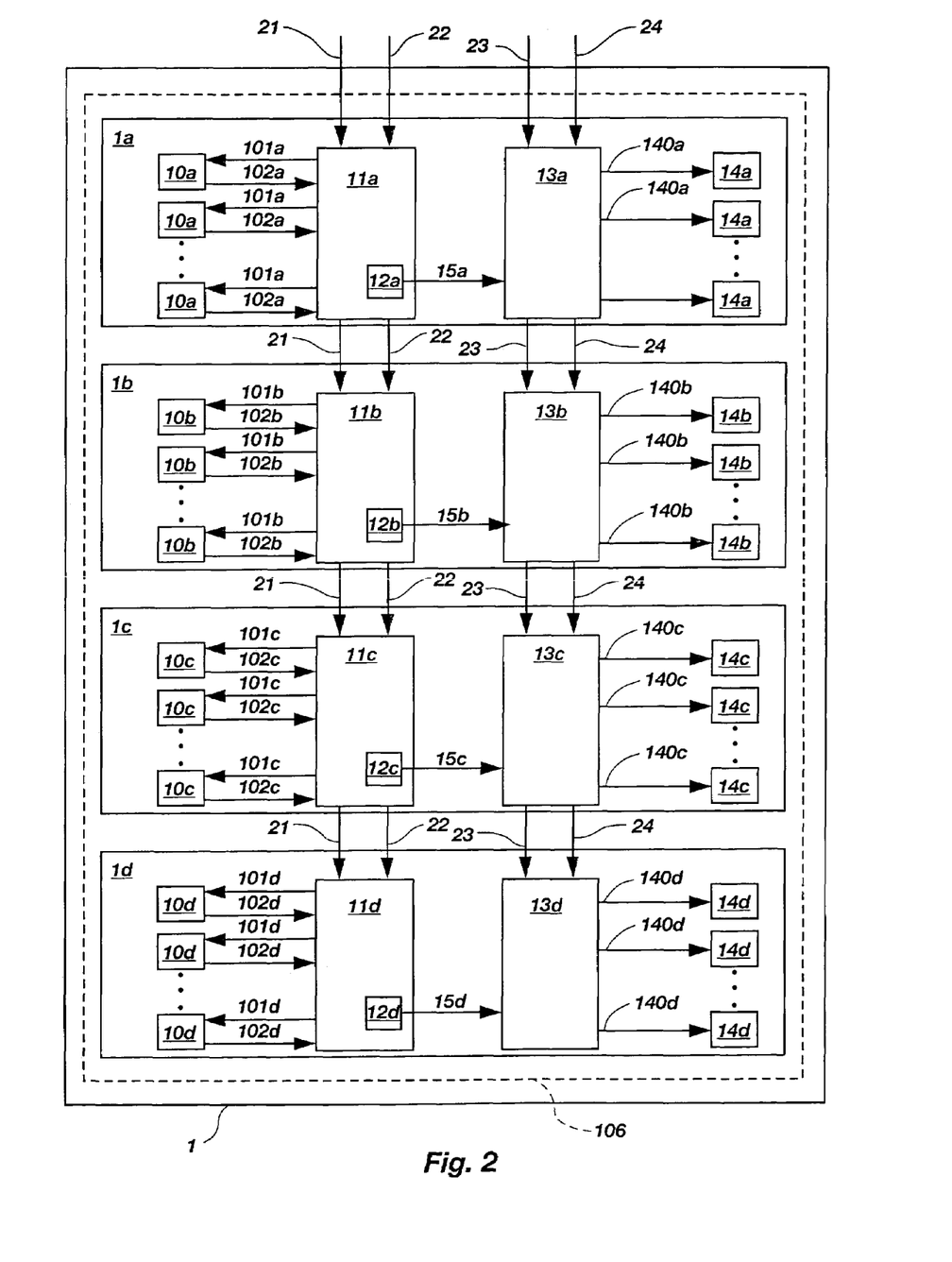
FIG. 2 is a block diagram of an integrated circuit having a plurality of subsections, each including comparator and set circuitry, according to an embodiment of the invention.

In the embodiment of the invention depicted in FIG. 1, integrated circuit device 1 includes a single test latch 12. At each test step, test latch 12 temporarily stores the result of the current test step and, as described above, enables the setting of a nonvolatile memory element 14 to permanently store the result of the test step. Thus, test latch 12 stores the result of one test step at a time, but stores the results of multiple test steps in sequence. It is contemplated, however, that in other embodiments of the invention, integrated circuit device 1 may include test circuitry 106 (surrounded by dashed line) which is divided into a plurality of subsections or quadrants 1a, 1b, 1c, and 1d, as depicted in FIG. 2. Each subsection may include a plurality of send/receive locations 10a, 10b, 10c and 10d accessed by corresponding input lines 101a, 101b, 101c and 101d and output lines 102a, 102b, 102c, and 102d. Each quadrant also includes a comparator circuit 11a, 11b, 11c, or 11d; a test latch 12a, 12b, 12c, or 12d; a latch signal line 15a, 15b, 15c or 15d communicating with set logic 13a, 13b, 13c or 13d. Each subsection may include a plurality of nonvolatile memory elements 14a, 14b, 14c or 14d set by lines 140a, 140b, 140c and 140d, respectively. Each test latch 12a, 12b, 12c or 12d stores the results of the current test step for a particular subsection. Test, test address, set and set address signals are sent on lines 21, 22, 23 and 24 as noted previously. Thus each subsection may be tested independently. Although four subsections are depicted in FIG. 2, this is merely exemplary, and the invention may include a larger or smaller number of subsections. If multiple test latches are used, each latch may be independently addressable or may be accessed by means of a dedicated line.

Figure 3:
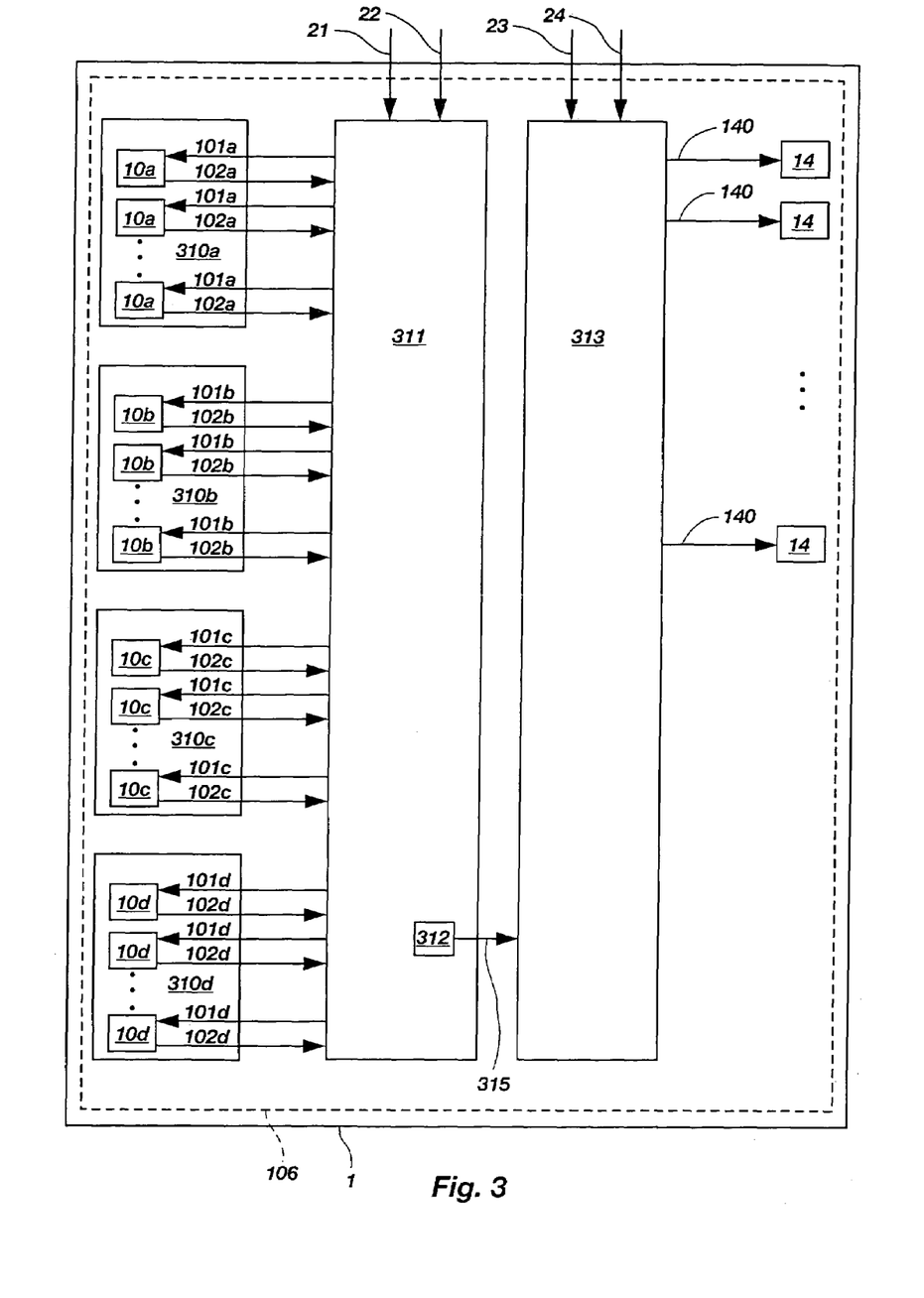
FIG. 3 is a block diagram of an integrated circuit having a plurality of subsections but a single comparator circuit and set circuit according to a further embodiment of the invention.

In yet another alternative embodiment of the invention, as depicted in FIG. 3, test circuitry 106 (enclosed by dashed line) includes a plurality of subsections 310a, 310b, 310c, 310d (four are shown here) each containing multiple send/receive locations 10a, 10b, 10c or 10d, which are accessed by input lines 101a, 101b, 101c and 101d, respectively; output lines 102a, 102b, 102c and 102d, respectively; a single comparator circuit 311; test latch 312; latch signal line 315; and set logic 313. This permits a comparison to be made between the values received from send/receive locations in the different subsections of the device. Multiple nonvolatile memory elements 14 are also included accessible by lines 140. Test, test address, set and set address signals are sent on lines 21, 22, 23 and 24, respectively.

The different embodiments of the invention are particularly suited for different types of device testing, as will be described hereinbelow. It will be appreciated that the embodiments of the invention depicted in FIGS. 1, 2 and 3 may be implemented on a single semiconductor device, with the send/receive locations 10 connected to one or more embodiments of the comparator circuitry 11, 11a, 11b, ..., 311a, 311b, ..., etc., in order to facilitate testing of the integrated circuit device 1 in a variety of test modes.

In yet another embodiment of the invention, multiple latches may be provided on integrated circuit device 1, or on each subsection of integrated circuit device 1, so that results of multiple test steps may be stored in latches prior to being stored in nonvolatile memory elements. Thus, multiple test steps may be presented in sequence, and the step of storing the test results in nonvolatile memory elements may be carried out after a sequence of test steps has been presented, rather than after each test step. Each latch may be independently addressable or may be accessed by means of a dedicated line.

Testing Procedure

During testing of an integrated circuit device 1, a variety of test signals may be sent to the device in sequence by the integrated circuit device tester 2. Values received or read from the device are compared with expected values. The results of the comparisons are ultimately stored on the device in multiple nonvolatile memory elements. Each nonvolatile memory element may represent the results of a particular test or test step. Nonvolatile memory elements may be configured to represent different time points or read points in a test sequence or to represent test results for particular regions of the integrated circuit device. An advantage of storing test results in nonvolatile memory elements on the device is that the nonvolatile memory elements can be checked later to determine results of tests as well as whether a test was carried out properly; the device thus carries its own test history.

In some cases, whether the result obtained at a particular test step may determine whether a subsequent test step should be carried out. Therefore, in such cases it will be necessary for test equipment, such as integrated circuit device tester 2, to read test results stored on integrated circuit device 1 so that an appropriate subsequent test step can be determined.

Prior art integrated circuit device testers include the intelligence for determining whether to set a nonvolatile memory element on the integrated circuit device by evaluating the results of tests performed on the device. With the present invention, the device being tested includes the intelligence to determine whether to set a given nonvolatile memory element to represent test results. The tester sends a set signal and a set address indicating the address of the nonvolatile memory element associated with the current test step for each test step. However, the nonvolatile memory element is set only if the set signal is present and the latch storing the result of the comparison indicates that the nonvolatile memory element should be set. The following examples describe the process by which test steps are delivered, test results are determined, and storage of test results on the semiconductor device in nonvolatile memory elements.

EXAMPLE 1

General Testing

Figure 4:
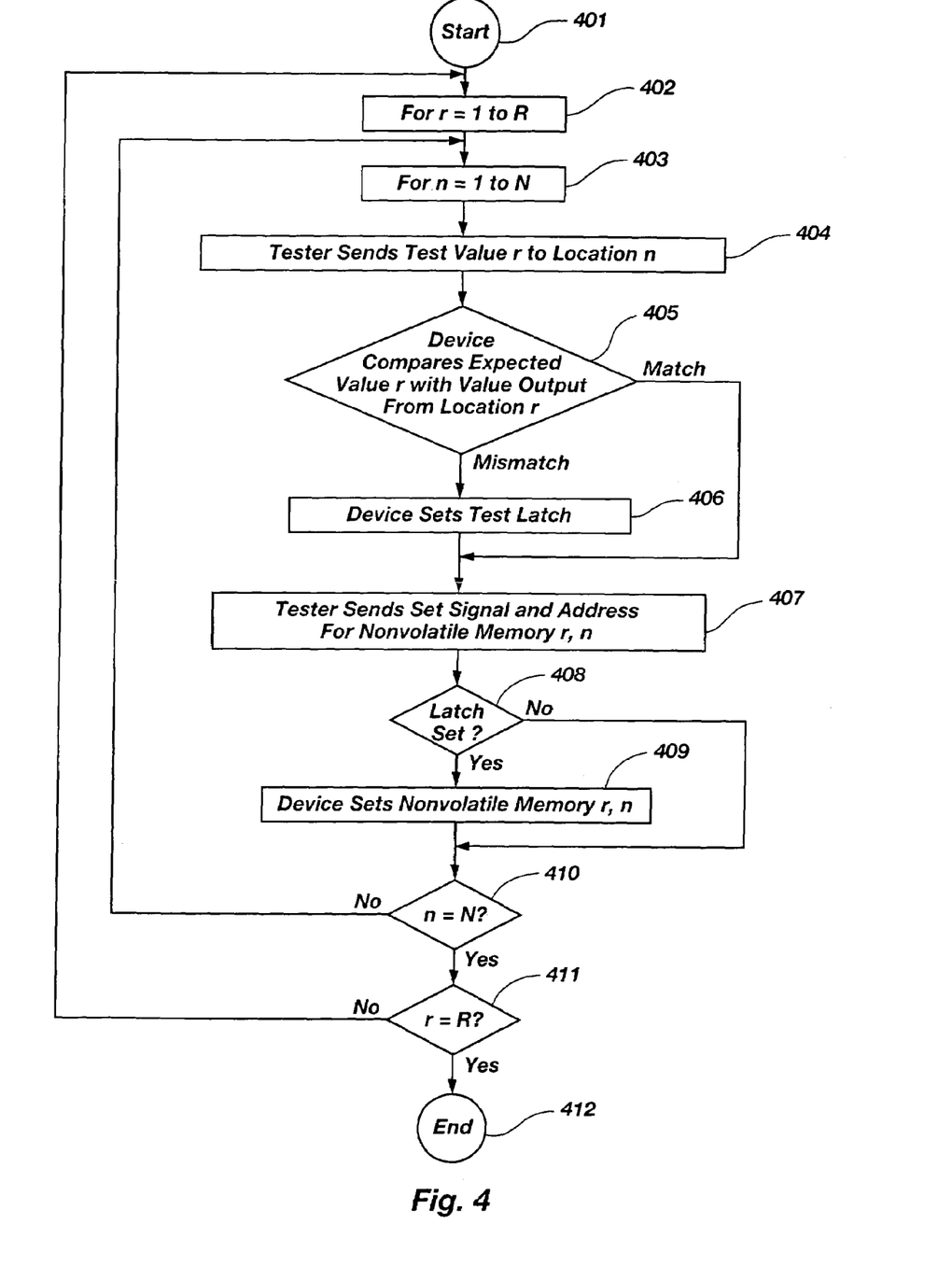
FIG. 4 is a flow diagram of the basic operation of an embodiment of the invention.

A flow diagram for the general test procedure used with the embodiment of the invention in FIG. 1 is shown in FIG. 4. This procedure may also be used for testing individual subsections of a device as in FIG. 2. In this example, a total number of R test steps are applied, with r representing the current test step. N is the total number of send/receive locations tested, with n representing the current send/receive location. The general testing procedure begins at 401 and is carried out for values of r=1 to R (step 402) and n=1 to N (step 403). The integrated circuit device tester sends the address for send/receive location n and test value r which is then stored in send/receive location n of the semiconductor device 1 (step 404). The comparator circuit for the semiconductor device or semiconductor device subsection then performs a comparison between the value received (read) from send/receive location n and the value expected to be obtained from that location in a properly functioning device (step 405). If the values do not match, the test latch is set appropriately (step 406). If the values do not match, control goes directly to step 407, in which the integrated circuit device tester sends a set signal and a set address signal to the semiconductor device. At step 408, set logic on the semiconductor device determines whether a set signal is present and the test latch has been set. If so, nonvolatile memory device r,n is set at step 409. If not, control goes directly to step 410, in which the device tester checks whether the send/receive location being tested is the last send/receive location. If not, control returns to step 403 and the tester delivers the test step to the next send/receive location. If at step 410 it is determined that the last send/receive location has been reached (that is, all send/receive locations have been tested with the current test step), the tester checks whether the last test step has been reached (step 411). If not, control returns to step 402 and the next test step is delivered. If the last test step has been delivered, testing is ended (step 412). It is preferred that a separate nonvolatile memory element is used at step 409 to store the result of each test step. At each test step, a single latch is used to store a value indicating whether setting of the nonvolatile memory element associated with that test step is to be enabled. On subsequent test steps, the same latch may be used to enable setting of different nonvolatile memory elements associated with the different test steps. There may be a single latch for each device for storing test step results, as shown in FIG. 1. Alternatively, it may be desirable to test several sections of a semiconductor device (e.g., subarrays of memory) separately and store test results in a separate latch for each section, in which case the semiconductor device as a whole would include at least as many latches as there were sections, as shown in FIG. 2. Although the flow diagram for the standard test in FIG. 4 shows the tester cycling through all send/receive locations for a given test step before moving on to the next test step, it may also be preferable to cycle through all test steps at a particular send/receive location before moving to the next send/receive location, that is, to place the loop beginning at step 403 outside the loop beginning at step 402.

EXAMPLE 2

Burn-In Testing

Figure 5:
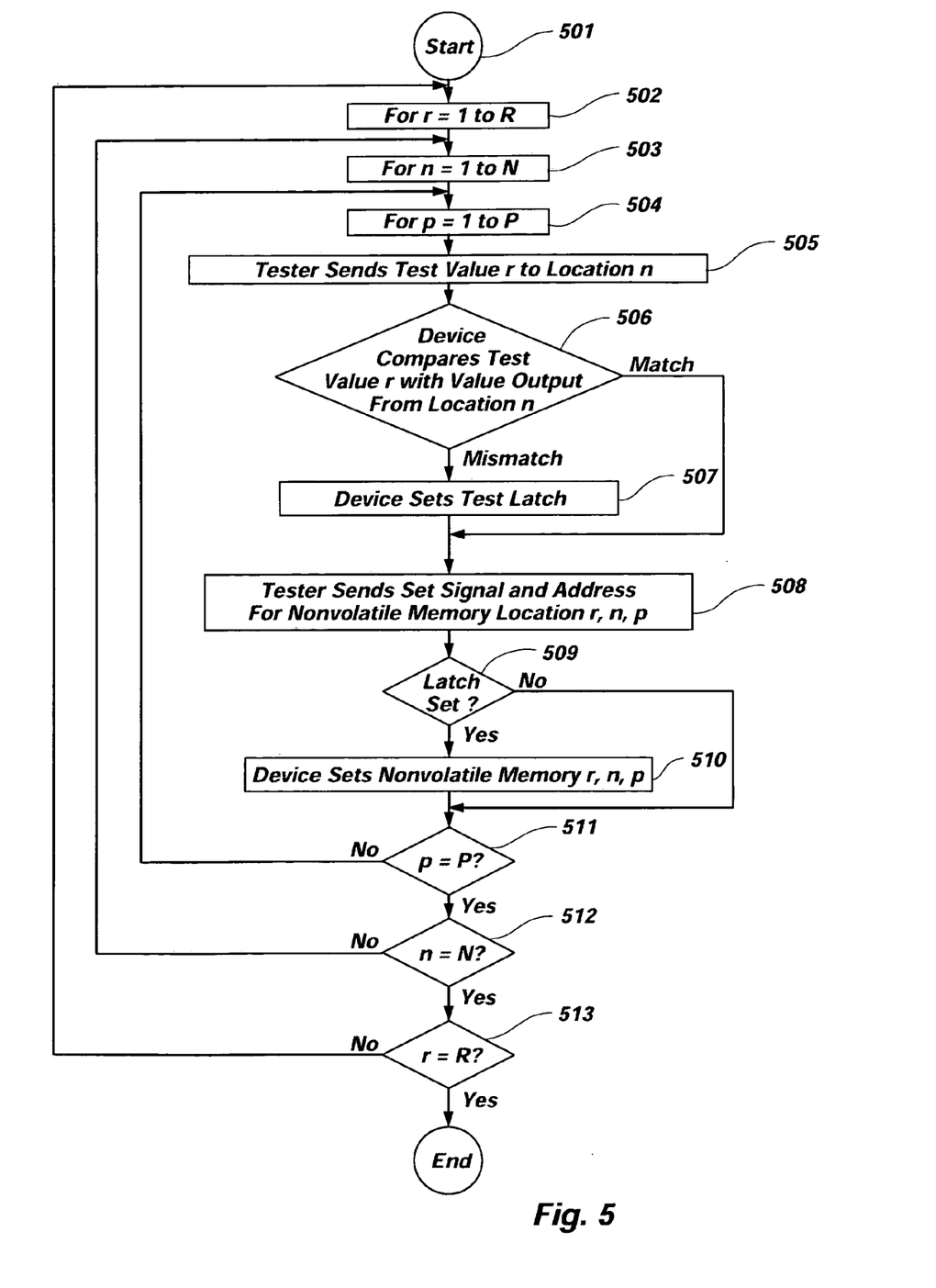
FIG. 5 is a flow diagram of the use of an embodiment of the invention in performance of a burn-in test.

A flow diagram for burn-in testing is provided in FIG. 5. This test procedure may be used with a device as depicted in FIG. 1, or subsection of a device as depicted in FIG. 2. During burn-in testing, a particular data value is written repeatedly to a particular send/receive location, typically under extreme conditions of temperature, voltage, timing, etc., in an effort to cause the failure of a device having some flaw that would cause it to fail early in its life cycle. Data are read from a given send/receive location at each repetition or at specified intervals in order to determine if and when failure occurs. Multiple nonvolatile memory elements may be used to store the pass/fail information for the different read points, with each nonvolatile memory element representing one read point. Read points may be used to represent specific time intervals throughout a burn in test such that, for example, a nonvolatile memory element is set after each hour of burn-in testing. Nonvolatile memory elements may also be used to store the number of the current read point, so that a record of the number of repetitions is stored on the device at all times during testing. In FIG. 5, R represents the total number of test steps, r the current test step, N represents the total number of send/receive locations tested, n the current send/receive location, P the total number of repetitions, and p the number of the current repetition. The burn-in test procedure begins at step 501, and is carried out for values of r=1 to R (step 502), n=1 to N (step 503), and p=1 to P (step 504). At each repetition p, the tester sends a test value r to send/receive location n (step 505). The semiconductor device compares the test value with the value read from send/receive location n (step 506). If a mismatch occurs, indicating a failure, the test latch is set at step 507. If the values match, step 507 is bypassed. The tester next sends a set signal and a set address corresponding to the nonvolatile memory elements designated to store the test result for the current repetition p (step 508). If a set signal is present and the test latch has been set (step 509), the semiconductor device causes the selected nonvolatile memory element to be set (step 510). Control returns to step 504 from step 511 until a total of P repetitions of the test signal have been delivered. Testing continues until all send/receive locations have been tested (step 512) and all test sequences have been delivered (513).

EXAMPLE 3

Compression Testing

Figure 6:
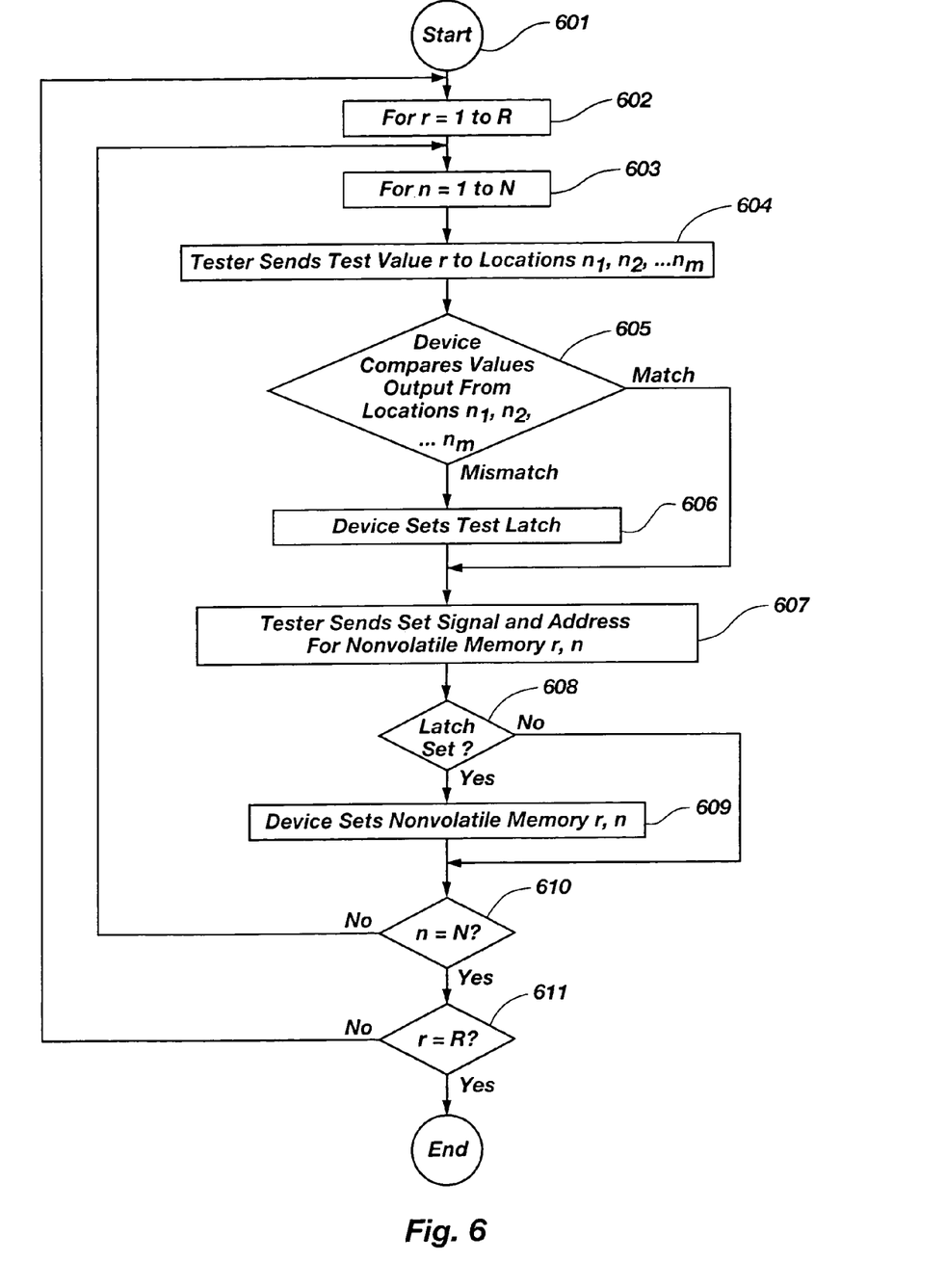
FIG. 6 is a flow diagram of the use of an embodiment of the invention in performance of a compression test.

Compression testing is used to shorten test times by simultaneously testing several identical subsections of a semiconductor device, or several regions on different devices of the same type. The block diagram of FIG. 3 depicts a semiconductor device having multiple subsections (four in this example, but any number greater than one could be used) and comparator circuit and set logic configured for use in compression testing. The same data values are simultaneously written to multiple subsections of the device (for example, to memory cells in multiple subsections of the device) and then data are read back from each subsection and values read from all subsections are compared. Matching values indicate that the test was passed. If a mismatch is detected, this indicates that some of the tested areas are not functioning properly and the test has been failed. If the test has been failed, a latch is set to enable or disable setting of a selected nonvolatile memory element. A flow diagram for compression testing is given in FIG. 6. R represents the total number of test steps, r the current test step, N the total number of send/receive locations tested in each subsection of the semiconductor device, and $N_1, N_2, N_3 \ldots N_m$ the current send/receive location in subsections 1 ... m of the semiconductor device. In FIG. 6, a semiconductor device with four subsections is depicted, so m=4, but it will be appreciated that this is merely exemplary, and a larger or smaller number of subsections could be used in the practice of the invention. Naturally, at least two subsections must be present in order to perform a comparison. The test procedure begins at step 601. The test procedure is carried out for values of r=1 to R (step 602) and n=1 to N (step 603). At step 604, test value r is simultaneously sent to send/receive locations $N_1, N_2, N_3 \ldots N_m$. At step 605, the semiconductor device compares the values received from send/receive locations $N_1, N_2, N_3 \ldots N_m$. If a mismatch is detected, a test latch is set (step 606). If all values match, step 606 is bypassed. The tester then sends a set signal and an address signal for nonvolatile memory element r,n (step 607). If a set signal is present and the test latch is set (step 608), the semiconductor device sets nonvolatile memory element r,n (step 609). Control returns to step 603 from step 610 until a total of N send/receive locations have been tested in each subsection with test step r. Testing continues until all test steps have been delivered (611).

Figure 7:
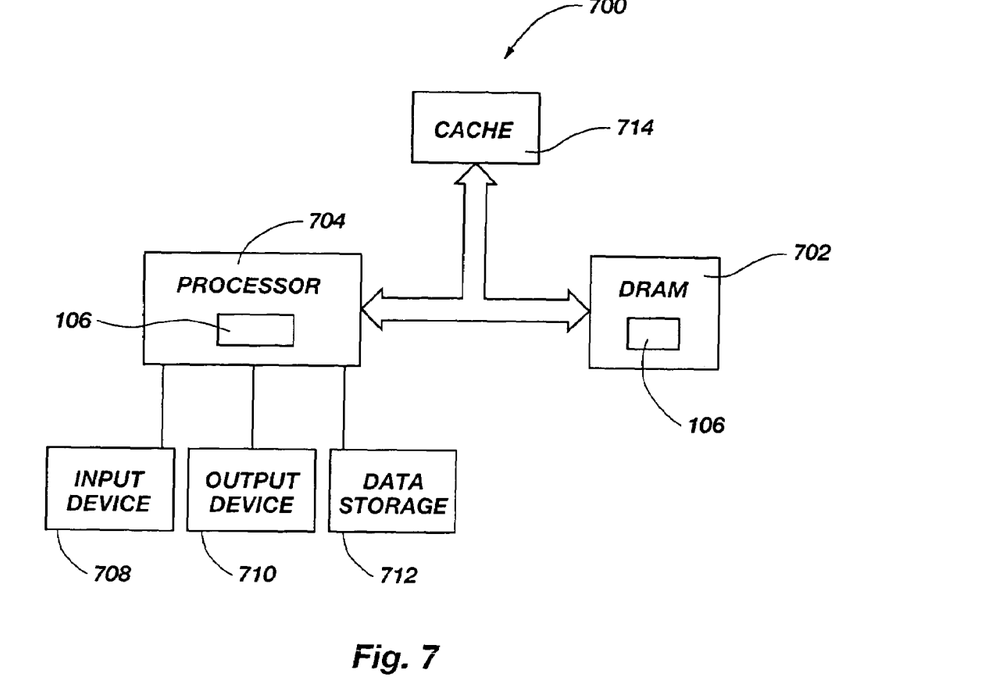
FIG. 7 is a block diagram of an electronic system including a semiconductor device having test circuitry according to the present invention.

FIG. 7 shows a block diagram of an electronic system 700 which includes components having one or more test circuits 106 configured according to one or more embodiments of the present invention. The electronic system 700 includes a processor 704 for performing various computing functions, such as executing specific software to perform specific calculations or tasks. Additionally, the electronic system 700 includes one or more input devices 708, such as a keyboard or mouse, coupled to the processor 704 to allow an operator to interface with the electronic system 700. The electronic system 700 also includes one or more output devices 710 coupled to the processor 704, such output devices including but not limited to a printer, a video terminal or a network connection. One or more data storage devices 712 are also conventionally coupled to the processor 704 to store or retrieve data from external storage media (not shown). Examples of conventional storage devices 712 include hard and floppy disks, tape cassettes, compact disks and optical memory. The processor 704 is also conventionally coupled to a cache memory 714, which is usually static random access memory ("SRAM"), and to DRAM 702. It will be understood, however, that the test circuit 106 configured according to one or more of the embodiments of the present invention may be incorporated into any one of the cache, DRAM, input, output, storage and processor devices 714, 702, 708, 710, 712 and 704.

Figure 8:
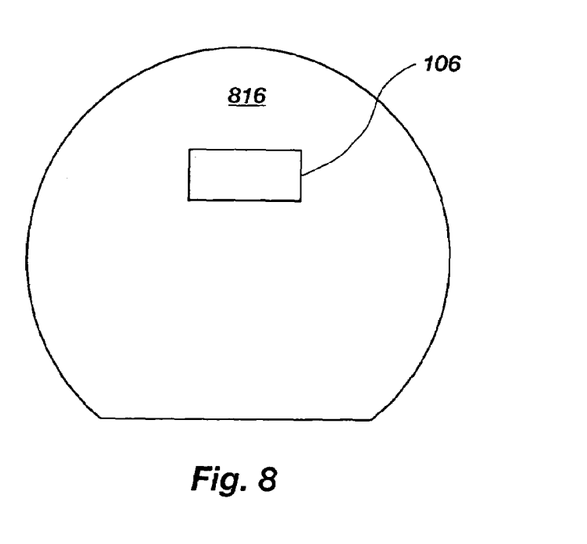
FIG. 8 is a diagram of a semiconductor wafer having test circuitry configured according to an embodiment of the present invention.

As shown in FIG. 8, test circuit 106 may be fabricated on the surface of a semiconductor wafer 816 of silicon, gallium arsenide, or indium phosphide in accordance with one or more embodiments of the present invention. One of ordinary skill in the art will understand how to adapt such design for a specific chip architecture or semiconductor fabrication process. Of course, it should be understood that the test circuit 106 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

As will be clear to one of ordinary skill in the art, the principles of the present invention may be used in conjunction with any number of the various semiconductor test methods known in the art and is not limited to those test methods described herein, or to the testing of memory devices. By including at least one latch circuit within a semiconductor device to indicate whether a nonvolatile memory element should be initiated, testing devices may be simplified. Additionally, by storing passing test result data as a mixed code of two different states rather than merely as a series of entirely the first state or the second state, the success of a series of tests may more accurately be determined.

While the present invention has been described and illustrated in terms of certain specific embodiments, those of ordinary skill in the art will understand and appreciate that it is not so limited. Additions to, deletions from and modifications to these specific embodiments may be effected without departing from the scope of the invention as defined by the claims. Furthermore, features and elements from one specific embodiment may be likewise applied to another embodiment without departing from the scope of the invention as defined herein.

What is claimed is:

1. An integrated circuit comprising:
   a location configured to receive a test signal and provide the test signal to an input of a logic function;
   comparator circuitry coupled to both an output of the logic function and an expected signal;
   a nonvolatile memory element configured to store a state of the comparator circuitry; and
   latching circuitry connected to an output of the comparator circuitry and to the nonvolatile memory element, the latching circuitry further configured to set the state within the nonvolatile memory element.

2. The integrated circuit of claim 1, wherein the nonvolatile memory element comprises a fuse.

3. The integrated circuit of claim 1, wherein the nonvolatile memory element comprises an antifuse.

4. The integrated circuit of claim 1, wherein the nonvolatile memory element comprises a FLASH memory cell.

5. The integrated circuit of claim 1, wherein the integrated circuit is a memory device.

6. The integrated circuit of claim 5, wherein the memory device is selected from a group consisting of a DRAM, a SRAM, a VRAM and a FLASH memory.

7. The integrated circuit of claim 1, wherein the integrated circuit is a microprocessor.

8. The integrated circuit of claim 1, wherein the integrated circuit is a microcontroller.

9. The integrated circuit of claim 1, wherein the integrated circuit is a memory controller.

10. The integrated circuit of claim 1, wherein the integrated circuit is an application specific integrated circuit (ASIC).

11. A memory device comprising:
    at least one memory location, the at least one memory location configured to receive a test signal and provide the test signal to an input of a logic function;
    comparator circuitry coupled to both an output of the logic function and an expected signal;
    a nonvolatile memory element configured to store a state of the comparator circuitry; and
    latching circuitry connected to an output of the comparator circuitry and to the nonvolatile memory element, the latching circuitry further configured to set the state within the nonvolatile memory element.

12. The memory device of claim 11, wherein the nonvolatile memory element is a fuse.

13. The memory device of claim 11, wherein the nonvolatile memory element is an antifuse.

14. The memory device of claim 11, wherein the nonvolatile memory element is a FLASH memory cell.

15. An electronic system comprising:
- at least one processor;
- at least one input device;
- at least one output device;
- at least one storage device;
- a test circuit incorporated into at least one device of the at least one processor, the at least one input device, the at least one output device, and the at least one storage device, the test circuit comprising:
  - a location configured to receive a test signal and provide the test signal to an input of a logic function;
  - comparator circuitry coupled to both an output of the logic function and an expected signal;
  - a nonvolatile memory element configured to store a state of the comparator circuitry; and
  - latching circuitry connected to an output of the comparator circuitry and to the nonvolatile memory element, the latching circuitry further configured to set the state within the nonvolatile memory element.

* * * * *